US007245017B2

(12) United States Patent
Nihei et al.

(10) Patent No.: US 7,245,017 B2
(45) **Date of Patent: *Jul. 17, 2007**

(54) LIQUID DISCHARGE HEAD AND MANUFACTURING METHOD THEREOF

(75) Inventors: Yasukazu Nihei, Kanagawa (JP); Tsuyoshi Mita, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 130 days.

This patent is subject to a terminal disclaimer.

(21) Appl. No.: 11/070,170

(22) Filed: Mar. 3, 2005

(65) Prior Publication Data

US 2005/0196958 A1 Sep. 8, 2005

(30) Foreign Application Priority Data

Mar. 4, 2004 (JP) ............................ 2004-060744

(51) Int. Cl.
*H01L 23/48* (2006.01)
*H01L 23/52* (2006.01)
*H01L 29/40* (2006.01)

(52) U.S. Cl. ...................... 257/758; 257/613; 257/200; 257/E21.097; 257/E21.117; 257/E21.126

(58) Field of Classification Search ................ 257/758, 257/759, 760, 765, 766, 11, 200, 201, 613, 257/614, 615

See application file for complete search history.

(56) References Cited

U.S. PATENT DOCUMENTS 6,435,675 B2 * 8/2002 Okura et al. .................. 347/86
6,888,729 B2 * 5/2005 Maekawa et al. ........ 363/56.02
6,945,633 B2 * 9/2005 Imanaka et al. .............. 347/58
2005/0185027 A1 * 8/2005 Nihei et al. ................... 347/68
2005/0195228 A1 * 9/2005 Mita et al. .................... 347/12

FOREIGN PATENT DOCUMENTS

JP 2003-136714 A 5/2003

* cited by examiner

*Primary Examiner*—David Nhu
(74) *Attorney, Agent, or Firm*—Birch, Stewart, Kolasch & Birch, LLP

(57) ABSTRACT

The liquid discharge head has a three-dimensional structure which defines a space including a pressure chamber filled with liquid and a flow channel for supplying the liquid to the pressure chamber, the three-dimensional structure being formed by depositing a composition material on a substrate according to a deposition method, and a drive element which causes discharge of the liquid from the pressure chamber through a nozzle.

4 Claims, 11 Drawing Sheets

LIQUID DISCHARGE HEAD AND MANUFACTURING METHOD THEREOF

BACKGROUND OF THE INVENTION

1. Field of the Invention

The present invention relates to a liquid discharge head and a manufacturing method thereof, and more particularly to a technique of using a deposition method in the manufacture of a liquid discharge head.

2. Description of the Related Art

Recently, in the field of the micro electrical mechanical systems (MEMS), it is considered that the devices using piezoelectric ceramics, such as sensors and actuators, have reached a higher level of integration and these elements are fabricated by a film formation that is suitable for practical use. As a case in point, an aerosol deposition method is known as a deposition technique for ceramics, a metal, or the like. In the aerosol deposition method, aerosol is made from powder of raw material, the aerosol is sprayed onto a substrate, and a film is formed on the substrate by deposition of the powdered material due to its impact energy.

When an inkjet head or another such liquid discharge head is manufactured, the main target product formed by the aerosol deposition method is a piezoelectric member for driving a diaphragm. Japanese Patent Application Publication No. 2003-136714 suggests a method for manufacturing a liquid discharge head wherein a diaphragm made from a metal oxide material is formed on a substrate made from a corrosion-resistant metal material according to the aerosol deposition method. In the manufacturing, after the diaphragm is formed on the substrate according to the aerosol deposition method, the portions of the substrate that server as ink liquid chambers (pressure chambers) are removed by etching, so that the substrate forms pressure chamber dividing walls.

In general, the diaphragms and the pressure chamber dividing walls in the inkjet head are affixed together by adhesive. On the other hand, the method suggested in Japanese Patent Application Publication No. 2003-136714 has merits that there is no need for an adhesion step for affixing the diaphragms with the pressure chamber dividing walls, because the diaphragms are formed according to the aerosol deposition method on the substrate that serves as the pressure chamber dividing walls.

However, the manufacturing method suggested in Japanese Patent Application Publication No. 2003-136714 is problematic in that it comprises a step for etching the substrate in order to form pressure chambers facing the diaphragms after the diaphragms are formed according to the aerosol deposition method, and hence the number of processes increases. There is no conventional technique in which the pressure chamber dividing walls are formed according to the aerosol deposition method.

Furthermore, the base part of the inkjet head has a three-dimensional structure defining spaces such as pressure chambers, which are filled with ink, and common flow paths for supplying ink to the pressure chambers. Miniaturization of this three-dimensional structure is essential if the nozzle density is to be increased in order to achieve high-quality of images formed by the inkjet head.

In the method of manufacture according to Japanese Patent Application Publication No. 2003-136714, pressure chambers are formed by etching a substrate; however, it is difficult to form complex spaces including the aforementioned flow paths, and the like, in the substrate, in addition to the pressure chambers, by etching the same substrate. The base part of the inkjet head generally has a multiple-layer substrate structure in which a plurality of substrates are bonded together in order to achieve a three-dimensional structure. Therefore, it is difficult to achieve downsizing, such as formation of a thin-film structure, formation of a fine structure, or the like. Moreover, if a three-dimensional structure is formed by means of a multiple-layer substrate, it is difficult to obtain a fine structure, due to problems of machining accuracy, breakages, warping and other stress damage. Further, in a structure which is formed with bonding by means of an adhesive, there has been a problem of uneven discharge pressure in the head, due to variations in the bonding layer or variations in the bonding strength. Furthermore, since the adhesive itself is an organic material, there have been problems in that the bonding force is liable to change over time, as well as stress-related change in properties over time, and hence improvements in durability are sought.

SUMMARY OF THE INVENTION

The present invention has been made in view of foregoing circumstances, and it is an object of the invention to provide a liquid discharge head and a method for manufacturing a liquid discharge head whereby a three-dimensional structure defining spaces of any shape including pressure chambers and flow paths can be formed as a monolithic structure, without having to bond together a plurality of substrates, and whereby downsizing, such as formation of a thin film structure and formation of a fine structure, can be achieved.

In order to attain the aforementioned object, the present invention is directed to a liquid discharge head, comprising: a three-dimensional structure which defines a space including a pressure chamber filled with liquid and a flow channel for supplying the liquid to the pressure chamber, the three-dimensional structure being formed by depositing a composition material on a substrate according to a deposition method; and a drive element which causes discharge of the liquid from the pressure chamber through a nozzle.

According to the present invention, since a three-dimensional structure having a space defining a pressure chamber, flow path, and the like, for a liquid discharge head is formed by a deposition method, there is no need to bond substrates together by means of an adhesive, or the like, and hence a monolithic structure can be achieve and downsizing becomes possible. It is possible to separately prepare a nozzle plate, in which nozzles are formed, and bond it to the three-dimensional structure. Alternatively, a nozzle plate may be formed by a deposition method.

Preferably, the deposition method includes an aerosol deposition method. The aerosol deposition is beneficial in that it allows easier formation of thick films, compared to other deposition techniques, such as sputtering, and furthermore, it makes it possible to preserve the crystalline structure of the powder starting material.

Preferably, the substrate includes a diaphragm; and the drive element includes a piezoelectric element which drives the diaphragm. More preferably, the piezoelectric element is formed by depositing a piezoelectric material on the diaphragm according to a deposition method. According to the present invention, the three-dimensional structure and the piezoelectric element are formed respectively by deposition on either surface of the diaphragm, and therefore stresses due to distortion during deposition are mutually cancelled out and warping of the diaphragm can be eliminated.

In order to attain the aforementioned object, the present invention is also directed to a method for manufacturing a liquid discharge head, the method comprising the steps of: spraying aerosol including raw material powder on a substrate by an aerosol deposition method; and depositing the powder on the substrate to form a three-dimensional structure defining a space including a pressure chamber filled with liquid and a flow channel for supplying the liquid to the pressure chamber.

The present invention is also directed to a method for manufacturing a liquid discharge head wherein aerosol including raw material powder is sprayed on a substrate by an aerosol deposition method, and the powder is deposited on the substrate to form a three-dimensional structure of a plurality of layers defining a space including a pressure chamber filled with liquid and a flow channel for supplying the liquid to the pressure chamber, the method comprising the steps of: (a) forming one of the plurality of layers as a patterned film by the aerosol deposition method; (b) filling a dissolving material into an opening of the patterned film; (c) forming the three-dimensional structure of the plurality of layers by repeating the steps (a) and (b); and (d) forming the space inside the three-dimensional structure by removing the dissolving material after the step (c).

According to the present invention, the three-dimensional structure is formed by repeating a step of forming patterned films by means of aerosol deposition, and a step of filling the opening in the layer formed as the patterned film, with a dissolving material. After forming the three-dimensional structure, the dissolving material is removed in order to form the three-dimensional structure defining spaces of a desired shape, such as pressure chambers and flow paths.

Preferably, the step (b) comprises the step of forming a film of the dissolving material by the aerosol deposition method so as to fill the opening of the patterned film formed in the step (a).

According to the present invention, a three-dimensional structure defining spaces including pressure chambers and flow paths is formed by depositing component material onto a substrate, and therefore the three-dimensional structure defining spaces of a desired shape for pressure chambers, and the like, can be formed as a monolithic structure, and therefore downsizing and adhesive-free manufacture become possible.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

General Configuration of an Inkjet Recording Apparatus

First, an inkjet recording apparatus provided with a liquid discharge head according to an embodiment of the present invention is described.

Figure 1:
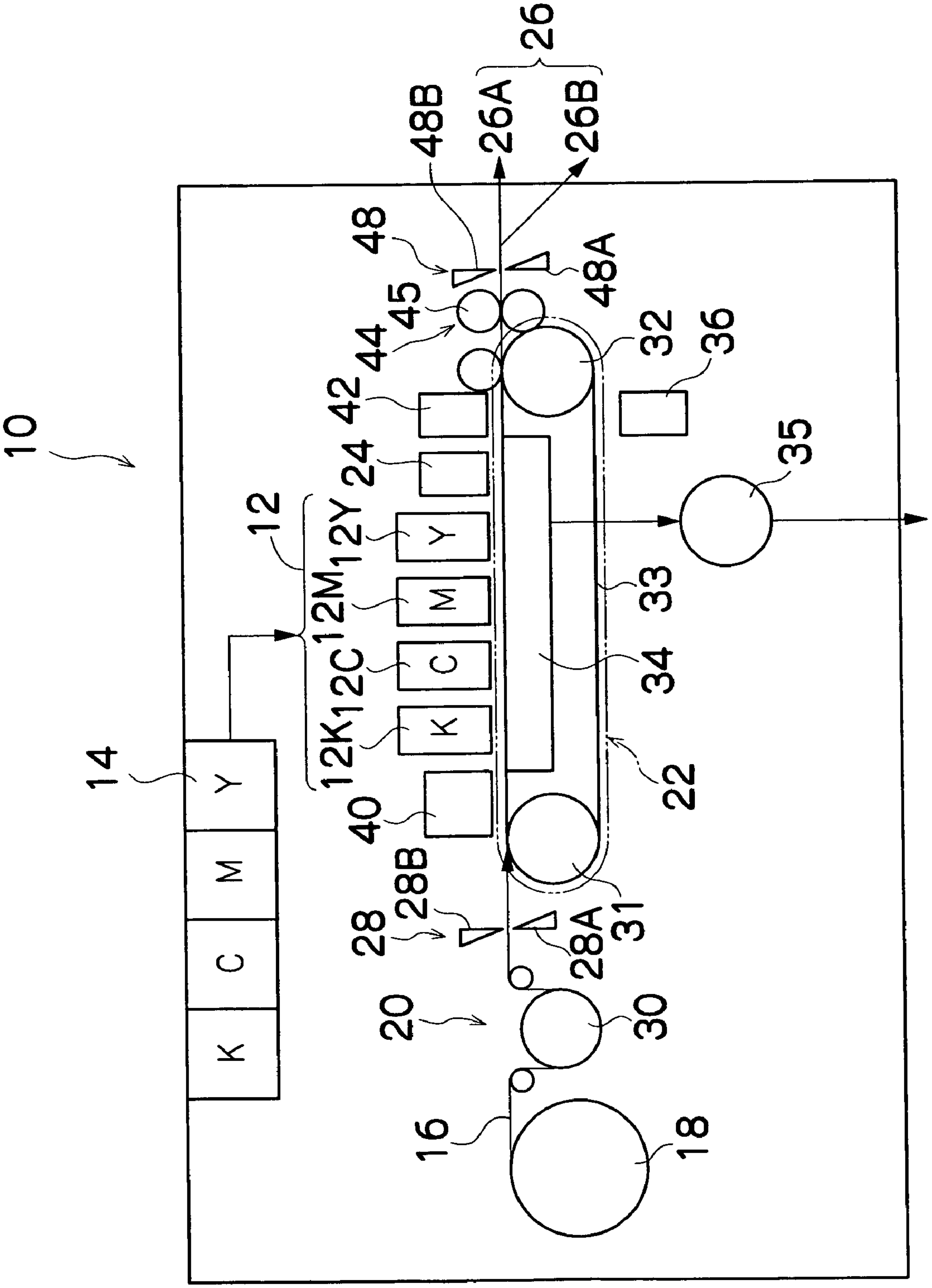
FIG. 1 is a general schematic drawing of an inkjet recording apparatus according to an embodiment of the present invention.

FIG. 1 is a general schematic drawing of the inkjet recording apparatus according to an embodiment of the present invention. As shown in FIG. 1, the inkjet recording apparatus 10 comprises: a printing unit 12 having a plurality of liquid discharge heads (hereinafter referred to as "heads", simply) 12K, 12C, 12M, and 12Y for ink colors of black (K), cyan (C), magenta (M), and yellow (Y), respectively; an ink storing/loading unit 14 for storing inks to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet discharge face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine.

In the case of the configuration in which roll paper is used, a cutter (first cutter) 28 is provided as shown in FIG. 1, and the continuous paper is cut into a desired size by the cutter 28. The cutter 28 has a stationary blade 28A, of which length is equal to or greater than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyor pathway. When cut paper is used, the cutter 28 is not required.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a horizontal plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1; and the suction chamber 34 provides suction with a fan 35 to generate a negative pressure, and the recording paper 16 is held on the belt 33 by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

Figure 2:
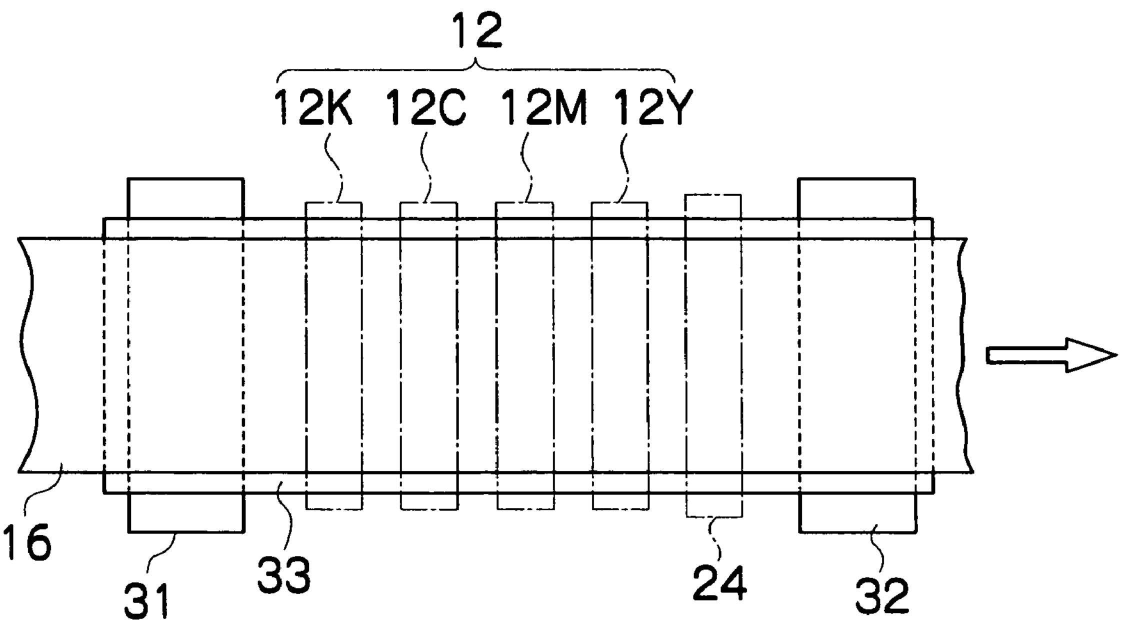
FIG. 2 is a main plan view of the periphery of the print unit in the inkjet recording apparatus shown in FIG. 1.

The printing unit 12 forms a so-called full-line head in which a line head having a length that corresponds to the maximum paper width is disposed in the main scanning direction perpendicular to the paper conveyance direction, which is substantially perpendicular to a width direction of the recording paper 16 (shown in FIG. 2). Each of the print heads 12K, 12C, 12M, and 12Y is composed of a line head, in which a plurality of ink-droplet discharge apertures (nozzles) are arranged along a length that exceeds at least one side of the maximum-size recording paper 16 intended for use in the inkjet recording apparatus 10, as shown in FIG. 2.

The print heads 12K, 12C, 12M, and 12Y are arranged in the order of black (K), cyan (C), magenta (M), and yellow (Y) from the upstream side along the paper conveyance direction. A color print can be formed on the recording paper 16 by discharging the inks from the print heads 12K, 12C, 12M, and 12Y, respectively, onto the recording paper 16 while conveying the recording paper 16.

The print determination unit 24 has an image sensor for capturing an image of the ink-droplet deposition result of the print unit 12, and functions as a device to check for discharge defects such as clogs of the nozzles in the print unit 12 from the ink-droplet deposition results evaluated by the image sensor.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathway in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48.

Film Formation Method Based on the Aerosol Deposition Method

Next, a film formation method based on the aerosol deposition method as used in the manufacture of a liquid discharge head according to the present embodiment is described.

Figure 3:
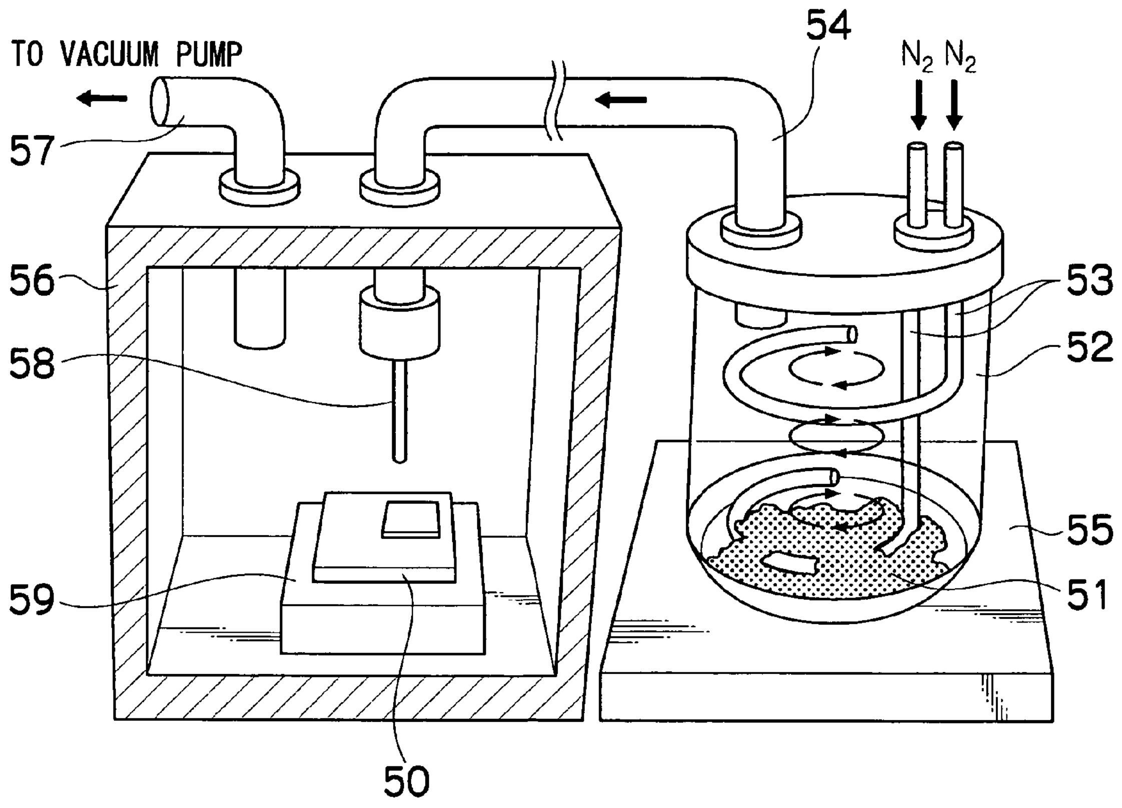
FIG. 3 is a schematic view showing a film forming apparatus for the aerosol deposition method.

FIG. 3 is a schematic drawing showing a film formation device based on the aerosol deposition method. This film formation device has an aerosol-generating chamber 52 in which raw material powder 51 are accommodated. Here, the “aerosol” stands for fine particles of a solid or liquid dispersed in a gas.

The aerosol-generating chamber 52 is provided with carrier gas input sections 53, an aerosol output section 54, and a vibrating unit 55. Aerosol is generated by introducing a gas, such as nitrogen gas ($N_2$), via the carrier gas input sections 53, then blowing and lifting the raw material powder that is present in the aerosol-generating chamber 52. In this case, by applying a vibration to the aerosol-generating chamber 52 by means of the vibrating unit 55, the raw material powder is churned up and the aerosol is generated efficiently. The aerosol thereby generated is channeled through the aerosol output section 54 to a film formation chamber 56.

The film formation chamber 56 is provided with an evacuate tube 57, a nozzle 58, and a movable stage 59. The evacuate tube 57 is connected to a vacuum pump to evacuate the gas from the film formation chamber 56. The aerosol, which is generated in the aerosol generating chamber 52 and is conducted to the film formation chamber 56 via the aerosol output section 54, is sprayed from the nozzle 58 onto a substrate 50. In this way, the raw material powder collides with the substrate 50 and is thereby deposited thereon. The substrate 50 is mounted on the movable stage 59, which is capable of the three-dimensional movement, and hence the relative positions of the substrate 50 and the nozzle 58 can be adjusted by controlling the movable stage 59.

Method for Manufacturing the Liquid Discharge Head

Next, a method for manufacturing the liquid discharge head according to the present embodiment is described.

Figure 4A:
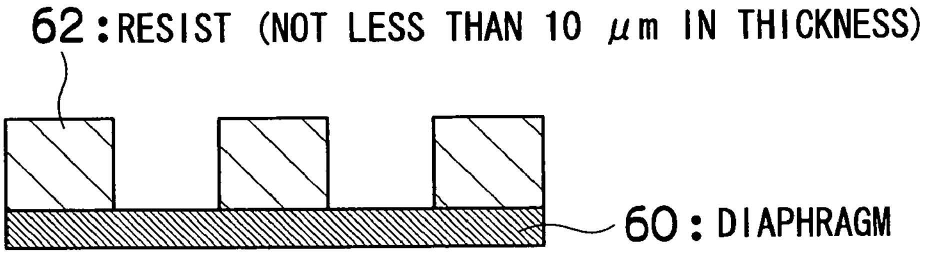
FIGS. 4A to 4C are diagrams showing the procedure for when a pressure chamber dividing wall is formed on a diaphragm according to the aerosol deposition method.
Figure 4B:
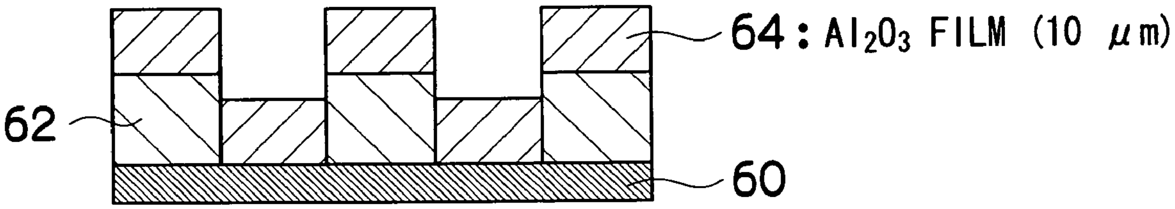
Figure 4C:
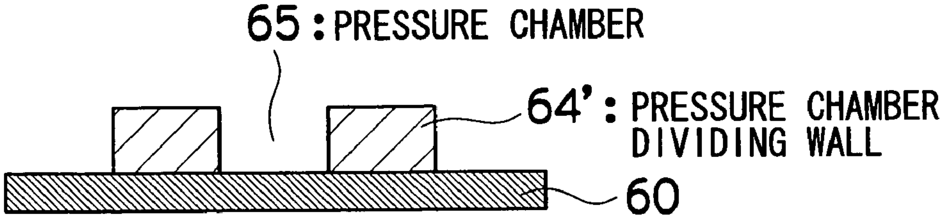

FIGS. 4A to 4C show the process of forming pressure chamber dividing walls 64' on a diaphragm 60 by the aerosol deposition method.

As shown in FIG. 4A, firstly, resists 62 having a planar shape of the pressure chambers are formed on the diaphragm 60 of stainless steel (SUS 430) (i.e., the resist patterning). The thickness of the resists 62 is not less than 10 μm in this embodiment. The diaphragm 60 is not limited to be of SUS 430, and glass, $SiO_2$, $Al_2O_3$, or another oxide ceramic may be used for the diaphragm 60, for example.

Next, as shown in FIG. 4B, an $Al_2O_3$ film 64 composed of a material for the pressure chamber dividing walls (for example, $Al_2O_3$) is formed according to the aerosol deposition method. More specifically, the $Al_2O_3$ film 64 with a thickness of about 10 μm are formed by use of the monocrystalline fine particle $Al_2O_3$ powder having an average particle size of about 0.3 μm and by means of driving the film formation device shown in FIG. 3.

Next, the resists 62 are dissolved by using acetone as shown in FIG. 4C, and the $Al_2O_3$ films 64 on the resists 62 are thereby lifted off. The pressure chamber dividing walls 64' composed of the $Al_2O_3$ film 64 are patterned on the diaphragm 60 as a result of the lift off. Pressure chambers 65 are formed by the pressure chamber dividing walls 64'.

Next, heat treatment (annealing) is carried out in order to remove the internal stress of the pressure chamber dividing walls 64'. The annealing is performed by maintaining the structure at 600° C. for one hour, for example. Etching can also be carried out as appropriate to achieve the desired thickness of the diaphragm 60.

Figure 5:
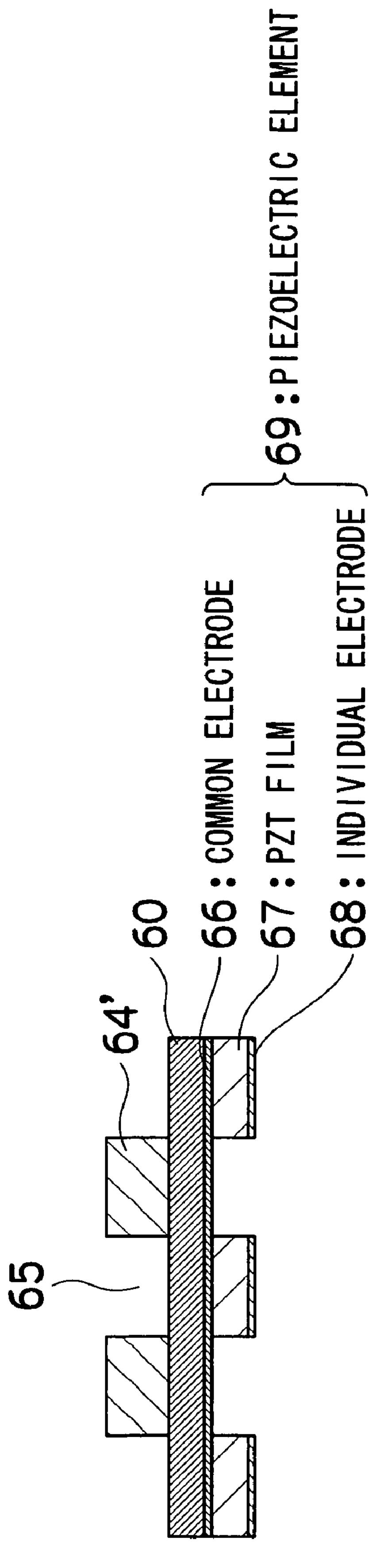
FIG. 5 is a diagram showing the state in which the pressure chamber dividing wall and a PZT film for driving the diaphragm are formed on the both sides of the diaphragm.

FIG. 5 shows the process of forming piezoelectric elements 69 on the reverse surface of the diaphragm 60.

Firstly, a common electrode 66 is formed on the reverse surface of the diaphragm 60. The common electrode 66 is made by forming a titanium oxide ($TiO_2$) layer serving as an adhesive layer by means of the sputtering or others, and then forming a platinum (Pt) layer, serving as a conductive layer, on the titanium oxide layer by means of the sputtering or others. Consequently, the common electrode 66 has a thickness of approximately 0.5 μm in total.

After the common electrode 66 is formed on the diaphragm 60 as described above, lead zirconate titanate (PZT) films 67 for driving the diaphragm 60 are formed on the common electrode 66 at positions corresponding to the pressure chambers 65, and an independent electrode 68 is formed on each of the PZT films 67. More specifically, similarly to the method illustrated in FIGS. 4A and 4B, the common electrode 66 is formed, the resist patterning is performed, then the PZT films 67 and the individual electrodes 68 are formed according to the aerosol deposition method, then the lift-off process is performed, and the PZT films 67 and the individual electrodes 68 are thus formed at the positions corresponding to the pressure chambers 65.

Then, the annealing and poling processes are carried out. When voltage is applied between the common electrode 66 and each of the individual electrodes 68, each of the poled PZT films 67 deforms in $d_{31}$ mode, in which the film extends and contracts in the lengthwise direction, so that each of the piezoelectric elements 69 drives the diaphragm 60.

In the present embodiment, the pressure chamber dividing walls 64' and the piezoelectric elements 69 are formed on both surfaces of the diaphragm 60 by the aerosol deposition method as described above, and then the following effects are confirmed.

Since the aerosol deposition method is a method for depositing a high-density film by spraying powder at high speed, the residual stress is liable to occur in the film during the formation. Consequently, it has been confirmed that the diaphragm is liable to be pulled by the film and to bend. By annealing the film to relieve the stress, the bending of the diaphragm is improved. However, it has been confirmed that, if the films are formed by the aerosol deposition method on both of the surfaces of the diaphragm as in the present method, then the stress distortion is cancelled out mutually and there is no need to perform annealing. Hence, it has been confirmed that the forming films by the aerosol deposition method on both of the surfaces of a diaphragm, as in the present composition, is effective from the viewpoint of canceling out distortion. Moreover, since the heat treatment can be reduced, beneficial effects, such as increased design freedom and lower costs due to the reduced number of processing steps, can be expected.

Although the piezoelectric elements 69 are formed by the aerosol deposition method in the embodiment shown in FIG. 5, the present invention is not limited thereto. For example, piezoelectric elements may be affixed to the diaphragm 60 with an adhesive.

Next, the process of making a monolithic structure from a three-dimensional structure containing the pressure chamber dividing walls 64' that reach from the diaphragm to the nozzle is described with reference to FIGS. 6A to 6F.

Figure 6A:
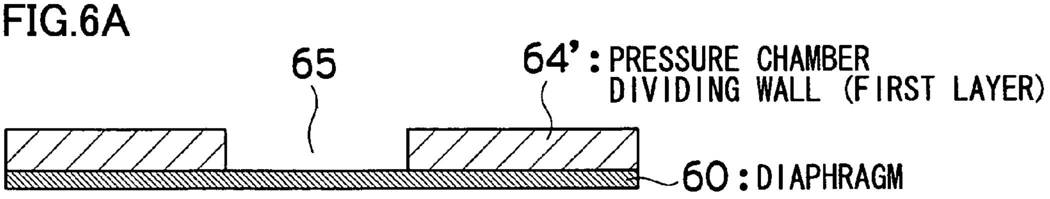
FIGS. 6A to 6F are diagrams showing the procedure of forming a monolithic structure for the three-dimensional structure from the diaphragm to the nozzle.

FIG. 6A shows the process by which the pressure chamber dividing walls 64' are patterned on the diaphragm 60. The pressure chamber dividing walls (first layer) 64' are patterned according to the aerosol deposition method, as shown in FIGS. 4A to 4C.

Figure 6B:
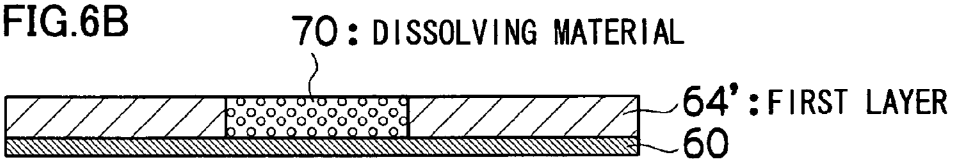

After the pressure chamber dividing walls 64' are patterned, a dissolving material 70 is formed according to the aerosol deposition method between the patterned pressure chamber dividing walls 64' as shown in FIG. 6B, and the space of the pressure chambers 65 is filled thereby. The dissolving material 70 is a material on which a film can be formed by the aerosol deposition method and which can be removed by wet etching (i.e., a method of immersing the structure into a liquid chemical).

Figure 6C:
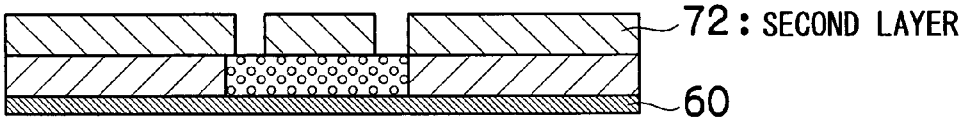
Figure 6D:
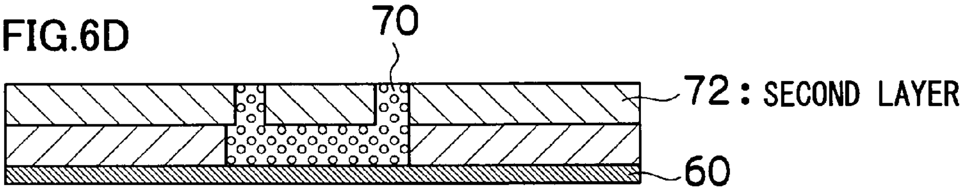

Next, a second layer 72 is patterned by the aerosol deposition method on each of the pressure chamber dividing walls (the first layer) 64', as shown in FIG. 6C. The second layer 72 is formed in the same manner as the forming the pressure chamber dividing walls (first layer) 64', and the dissolving material 70 is filled between the patterned second layer 72 as shown in FIG. 6D.

Figure 6E:
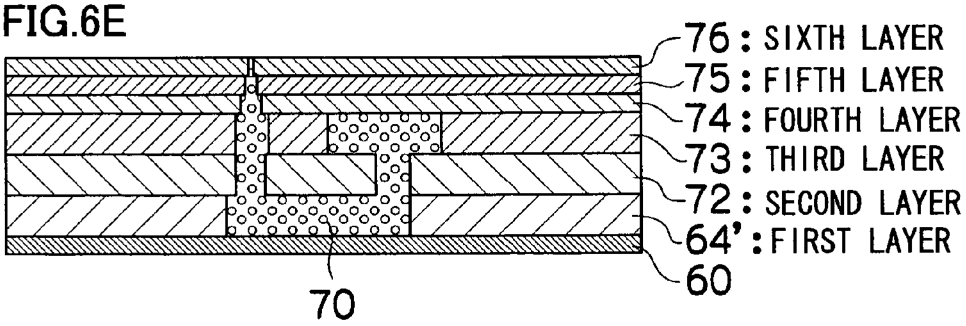

Third layer 73, fourth layer 74, fifth layer 75, and sixth layer (corresponding to the nozzle plate) 76 are sequentially formed in the same manner as shown in FIG. 6E.

Figure 6F:
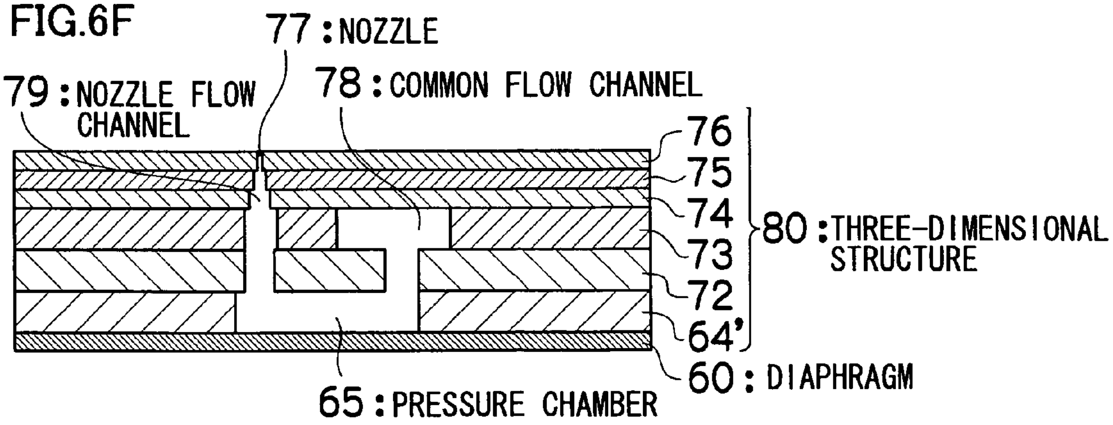

Then, as shown in FIG. 6F, the dissolving material 70 is removed by the wet etching. A three-dimensional structure 80, which has the pressure chamber 65, a common flow channel 78 for supplying ink to the pressure chamber 65, a nozzle flow channel 79 for supplying ink to a nozzle 77 from the pressure chamber 65, and other such spaces, is thereby formed.

The layers constituting the three-dimensional structure 80 from the pressure chamber dividing wall (first layer) 64' to the nozzle plate (sixth layer) 76 are patterned with resist patterns that have different shapes. A three-dimensional monolithic structure, which has spaces of arbitrary shapes including the pressure chambers and others, can be formed by appropriately setting the shape of the resist patterns of each layer and the thickness of each layer.

Although the nozzle plate (the sixth layer) 76 having the nozzle 77 is formed by the aerosol deposition method in this embodiment, the present invention is not limited thereto. A prepared nozzle plate, which is set aside, may be affixed by an adhesive. If the nozzle plate is affixed with adhesive, the nozzle pitch and nozzle diameter can be made with a high degree of accuracy, compared with the case where the nozzle plate is formed by the aerosol deposition method.

Although the layers constituting the three-dimensional structure 80 are formed using powder of the same composition material, the present invention is not limited thereto. The layers may be formed using powders of different composition materials between the layers, or each of the layers may be formed using powders of different composition materials within one layer.

Next, the process of forming the pressure chamber dividing walls by the aerosol deposition method on the diaphragm with the use of two or more different powdered composition materials is described with reference to FIGS. 7A to 7C.

Figure 7A:
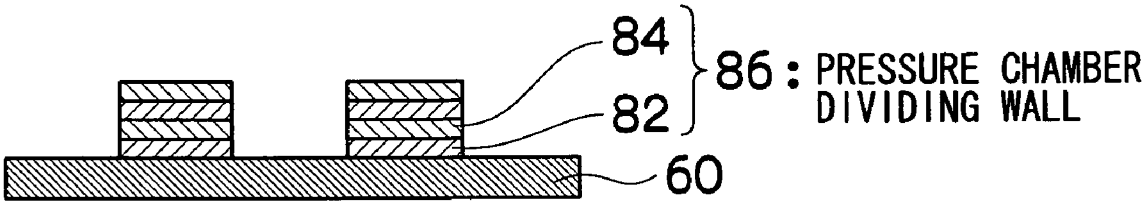
FIGS. 7A to 7C are diagrams for describing an embodiment whereby the pressure chamber dividing wall is formed on the diaphragm according to the aerosol deposition method using powders of two or more different composition materials.

FIG. 7A shows the pressure chamber dividing walls 86 formed by stacking layers 82 and layers 84. The composition material of the layers 82 and the composition material of the layers 84 are different.

The layers 82 are formed from a highly rigid composition material, and the layers 84 are formed from a highly ink-resistant composition material. Thus, the pressure chamber dividing wall 86 with a multilayered structure of the layers 82 and the layers 84 has the averaged characteristics (the high rigidity and the high corrosion resistance) of the composition materials of the layers 82 and 84.

When the pressure chamber dividing wall 86 is formed by the aerosol deposition method, a first aerosol production container that stores a first powder composed of a highly rigid composition material and a second aerosol production container that stores a second powder composed of a highly ink-resistant composition material are prepared, and the aerosol flow channels are switched such that the first and second aerosols produced by the first and second aerosol production containers are alternately sprayed from the spray nozzles.

The composition materials of the layers constituting the pressure chamber dividing wall are not limited to those in the above embodiment, and a composition material with high affinity in the aerosol deposition method, a composition material with high liquid-philicity with ink, or another such composition material may be selected as the composition material of each layer. Moreover, the pressure chamber dividing wall may be configured by sequentially stacking layers composed of three or more composition materials. Furthermore, along with the pressure chamber dividing wall (the first layer), other layers (e.g., at least one of the second layer 72 through the sixth layer 76 shown in FIG. 6E) may also be configured similar to the first layer.

Figure 7B:
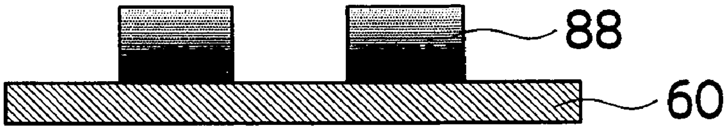
Figure 7C:
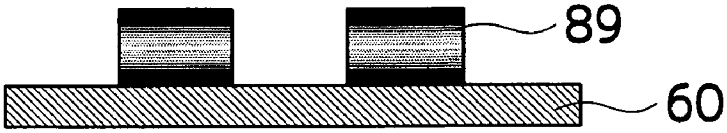

FIGS. 7B and 7C show embodiments of the pressure chamber dividing walls with compositions that have a gradient.

More specifically, the pressure chamber dividing walls 88 and 89 shown in FIGS. 7B and 7C are formed by continuously varying the mixture ratio of the first aerosol and the second aerosol composed of two composition materials and spraying the mixed aerosol from the spray nozzle to deposit powders on the diaphragm 60. Thereby, the pressure chamber dividing walls 88 and 89 are formed as film. The pressure chamber dividing wall 88 has a continuous gradient composition from one end to the other of the pressure chamber dividing wall 88. The pressure chamber dividing wall 89 has a continuous gradient composition from both ends to the middle of the pressure chamber dividing wall 89. The mixture ratio of the two aerosols is not limited to being continuously varied in the thickness direction of the film, and may be varied discontinuously (in some steps).

Next, another embodiment is described wherein the three-dimensional structure including the pressure chambers is configured from two or more composition materials.

First Embodiment of Head for Improving Affinity During Material Adhesion

Figure 8:
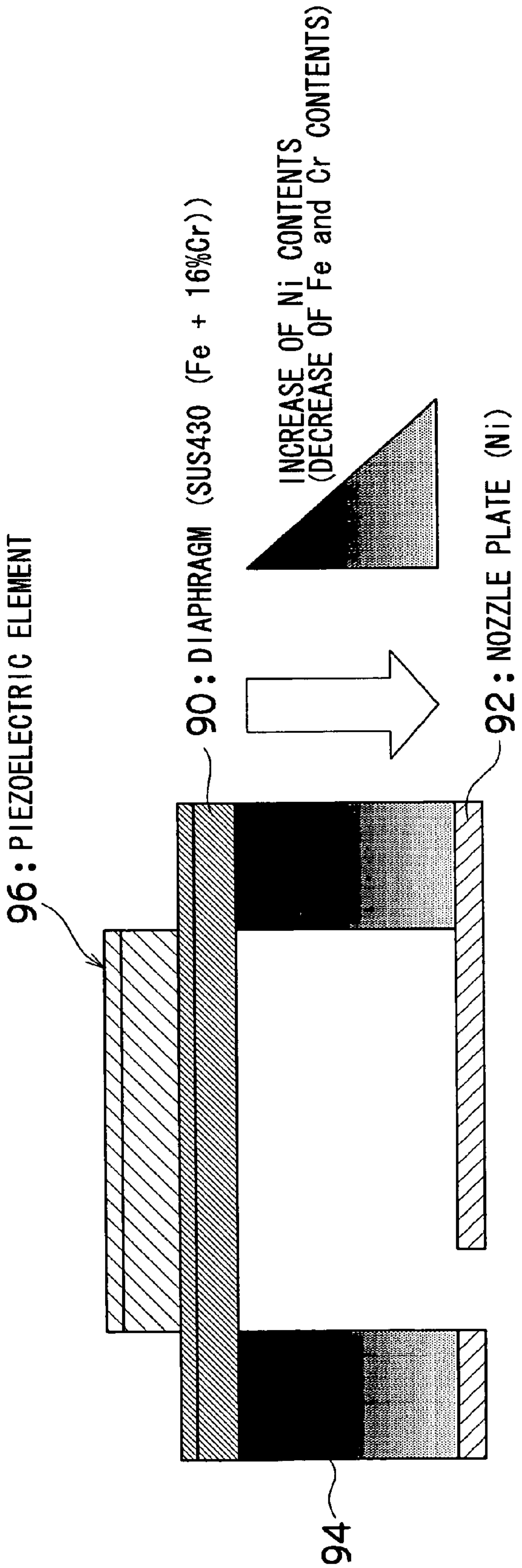
FIG. 8 is a cross-sectional view of a head including the pressure chamber dividing wall having the composition material with the gradient composition.

FIG. 8 is a cross-sectional view of a head including the pressure chamber dividing wall that has a gradient composition of the composition material. The diaphragm 90 of the head in the first embodiment shown in FIG. 8 is configured from stainless steel (SUS 430). A nozzle plate 92 is configured from nickel (Ni). In this case, the pressure chamber dividing wall 94, which is a three-dimensional structure from the diaphragm 90 to the nozzle plate 92, has a gradient in composition so that the composition material of the pressure chamber dividing wall 94 varies continuously from SUS 430 to nickel.

More specifically, when powders are deposited on the diaphragm 90 by the aerosol deposition method, firstly, the first aerosol containing the SUS 430 powder is sprayed on the diaphragm 90 to deposit the SUS 430 powder. Then, the mixture ratio of the first aerosol and the second aerosol containing nickel powder is continuously varied (the proportion of the first aerosol is gradually reduced, while the proportion of the second aerosol is gradually increased). Then, only the second aerosol is sprayed at a location where the nozzle plate 92 is formed, thereby the nickel powder is deposited at the location.

By the gradient composition of the pressure chamber dividing wall 94, it is possible that the compositions of the pressure chamber dividing wall 94 can be the same or substantially the same with the compositions of the diaphragm 90 at the bonding part between the pressure chamber dividing wall 94 and the diaphragm 90, and can also be the same or substantially the same with the compositions of the nozzle plate 92 at the bonding part between the pressure chamber dividing wall 94 and the nozzle plate 92. Consequently, it is possible that the adhesion between the diaphragm 90 and the diaphragm 94 can be improved and the adhesion between the nozzle plate 92 and the diaphragm 94 can be improved.

Moreover, if the pressure chamber dividing wall 94 is the same or substantially the same with each of the diaphragm 90 and the nozzle plate 92 in compositions at each bonding part, then the pressure chamber dividing wall 94 is also the same or substantially the same with each of the diaphragm 90 and the nozzle plate 92 in the coefficients of linear expansion at each bonding part in heat bonding and temperature control of the head. Consequently, there is the effect that the adhesion failure can be suppressed.

Furthermore, if the compositions of the diaphragm 90 and the nozzle plate 92 are the same or the substantially same and the compositions in the bonding sections thereof are the same or the substantially same, the top and bottom surfaces of the head are formed with the substantially same composition material and the substantially same thickness. Consequently, there is the effect that the occurrence of curving can be suppressed.

In FIG. 8, a reference numeral 96 denotes a piezoelectric element for driving the diaphragm 90.

Second Embodiment of Head for Preventing Air Bubbles During Ink Filling

Figures 9A, 9B, 9C:
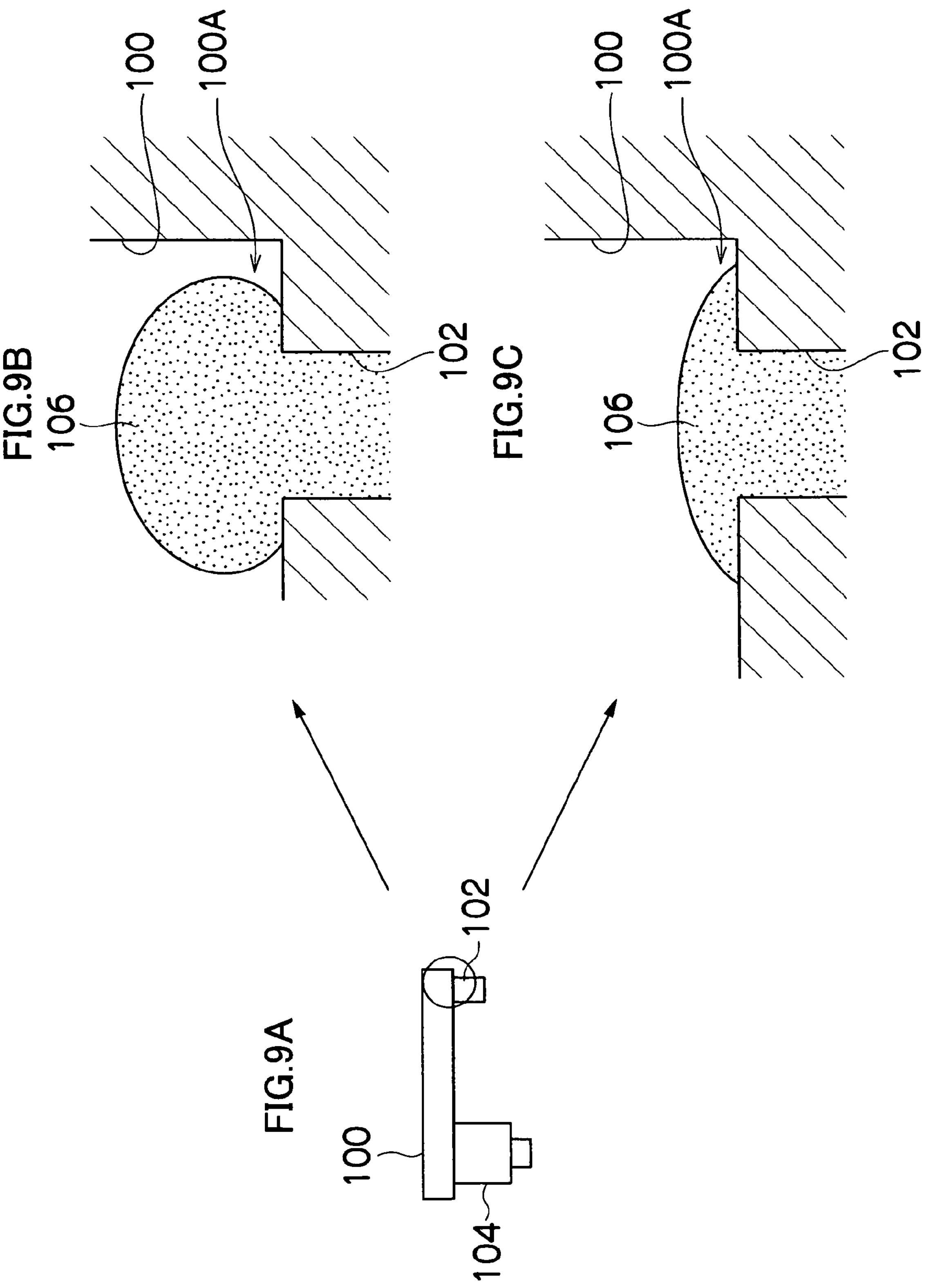
FIGS. 9A to 9C are diagrams for describing the cause of the generation of air bubbles when ink is filled.

FIGS. 9A to 9C are diagrams for describing the cause of air bubbles when ink is filled, and FIG. 9A shows a pressure chamber 100, a supply channel 102 for supplying ink to the pressure chamber 100, and a nozzle flow channel 104.

FIGS. 9B and 9C are enlarged cross-sectional views of FIG. 9A showing the essential part. FIGS. 9B and 9C show the configuration related to the connecting section between the pressure chamber 100 and the supply channel 102.

When ink is supplied from the supply channel 102 into the pressure chamber 100, if the edge of the ink 106 becomes spherical as shown in FIG. 9B, a space (air bubble) can remain between the ink 106 and the corner 100A of the pressure chamber 100. Conversely, if the edge of the ink 106 does not become spherical as shown in FIG. 9C, no air bubble remains between the ink 106 and the corner 100A of the pressure chamber 100.

The shape of the edge of the ink 106 varies depending on the viscosity of the ink 106 and/or the liquid-philicity of the wall of the pressure chamber 100 with the ink 106. When the viscosity of the ink 106 is kept constant, the higher the liquid-philicity of the pressure chamber 100 is, the more effectively the occurrence of air bubbles can be prevented.

In the present specification, the term "liquid-philic" means "having a strong affinity for the liquid (e.g., the ink in the inkjet head)". For example, in the case where the liquid or the ink is an aqueous solution or water-based, the terms "liquid-philic" and "liquid-philicity" correspond to "hydrophilic" and "hydrophilicity", respectively. On the other hand, in the case where the liquid or the ink is an oleaginous solution or oil-based, the term "liquid-philic" and "liquid-philicity" correspond to "oleophilic" and "oleophilicity".

Figure 10:
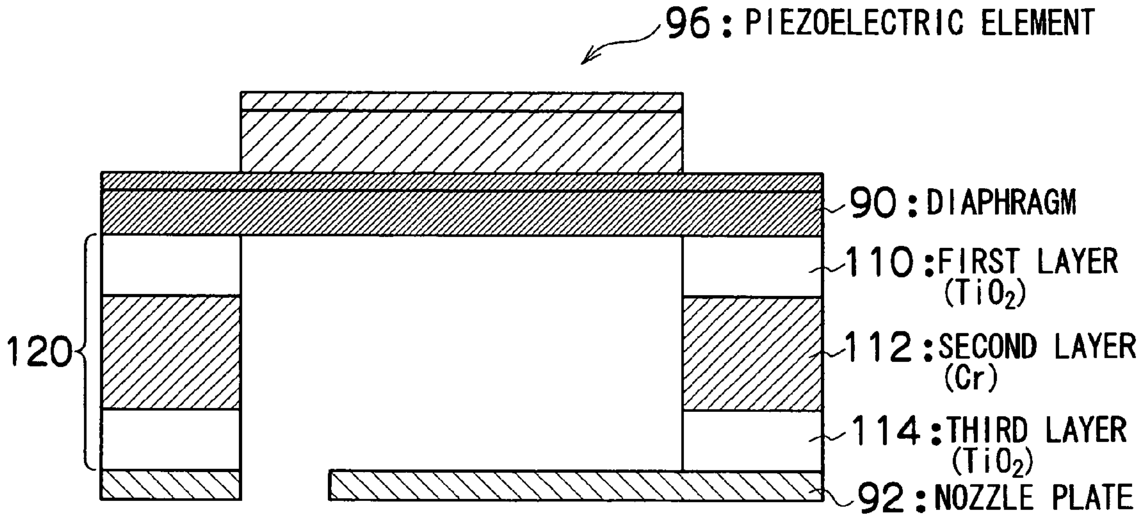
FIG. 10 is a cross-sectional view of a head containing a pressure chamber dividing wall that prevents air bubbles from forming when ink is filled.
Figure 11:
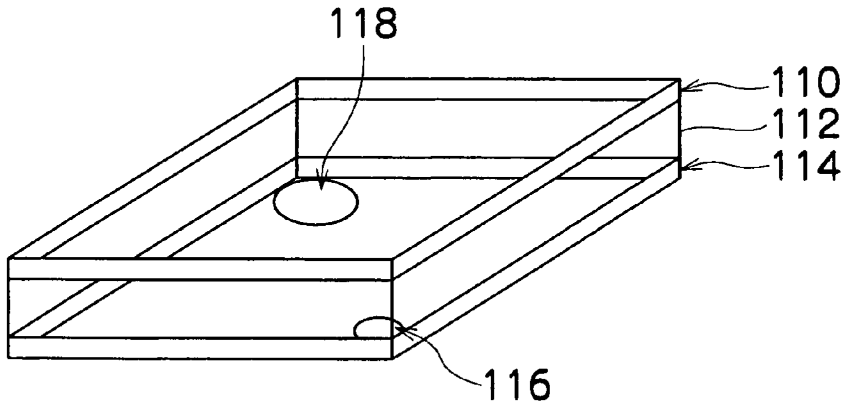
FIG. 11 is a perspective view of a pressure chamber with a pressure chamber dividing wall that prevents the generation of the air bubbles when ink is filled.

FIG. 10 is a cross-sectional view of the head including the pressure chamber dividing wall that prevents air bubbles from forming when the ink is filled. FIG. 11 is a perspective view of the pressure chamber in the head shown in FIG. 10. In FIG. 10, the components common to the components in FIG. 8 are denoted with the same reference numerals, and detailed descriptions thereof are omitted. In FIG. 11, an opening 116 in the pressure chamber communicates with the ink supply channel, and an opening 118 in the pressure chamber communicates with the nozzle flow channel.

As shown in FIG. 10, the pressure chamber dividing walls 120 extending from the diaphragm 90 to the nozzle plate 92 is formed by stacking a first layer 110 composed of $TiO_2$, ZnO, and/or another liquid-philic material; a second layer 112 composed of Cr, another metal, a ceramic, and/or another such material; and a third layer 114 composed of a liquid-philic material. The layers of the pressure chamber dividing wall 120 are configured by sequentially forming films according to the aerosol deposition method.

Air bubbles are likely to remain in the corner of the pressure chamber as described in FIGS. 9A to 9C. In view of that, in the head in the second embodiment, the composition materials of the layers constituting the corners (e.g., the first layer 110 and the third layer 114) are made from liquid-philic materials so that the degree of the air bubble affinity to the wall of the corner of the pressure chamber is equal to the degree of the air bubble affinity to the other walls.

The pressure chamber dividing wall 120 of the head in the second embodiment may have a continuous gradient composition, similar to the pressure chamber dividing wall 94 of the head in the first embodiment shown in FIG. 8.

Third Embodiment of Head Capable of Stable Ink Supply

Figure 12:
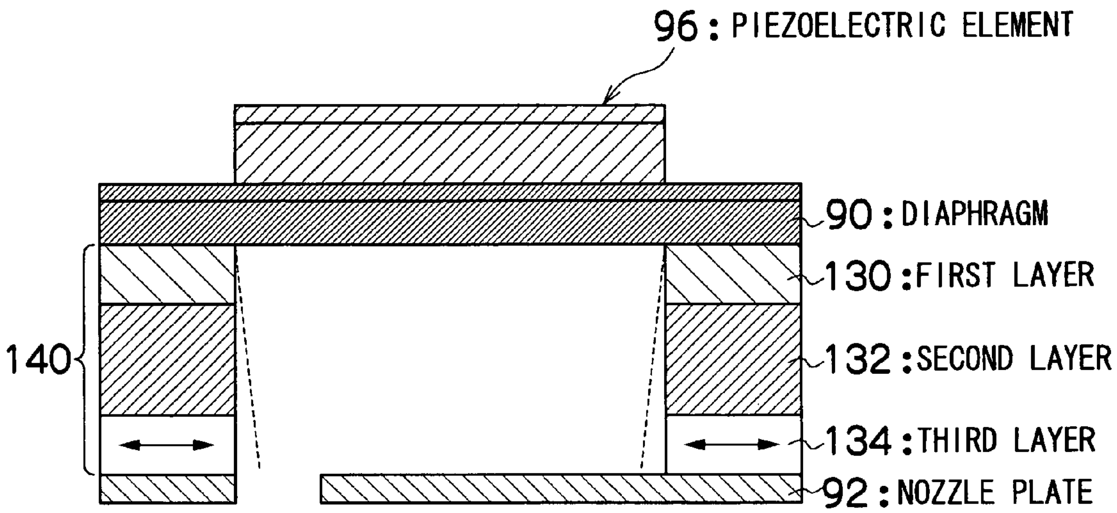
FIG. 12 is a cross-sectional view of a head containing a pressure chamber dividing wall whereby ink can be supplied in a stable manner.

FIG. 12 is a cross-sectional view of the head including a pressure chamber dividing wall capable of supplying ink stably. In FIG. 10, the components common to the components in FIG. 8 are denoted with the same reference numerals, and detailed descriptions thereof are omitted.

In FIG. 12, the pressure chamber dividing wall 140 from the diaphragm 90 to the nozzle plate 92 is formed by stacking a first layer 130 composed of Cr, Ni, and/or another highly rigid material; a second layer 132; and a third layer 134 composed of Mg, a resin, and/or another material of low rigidity. The second layer 132 is composed of a material with the rigidity between the rigidity of the first layer 130 and the rigidity of the third layer 134. The pressure chamber dividing walls 140 have a structure with a gradient rigidity composition in which the rigidity decreases from the diaphragm 90 towards the nozzle plate 92. The layers of the pressure chamber dividing wall 140 are configured by sequential film forming according to the aerosol deposition method. The resin layer is formed by the aerosol deposition method in which the material is deposited without the use of mechanochemical reactions.

Figure 13:
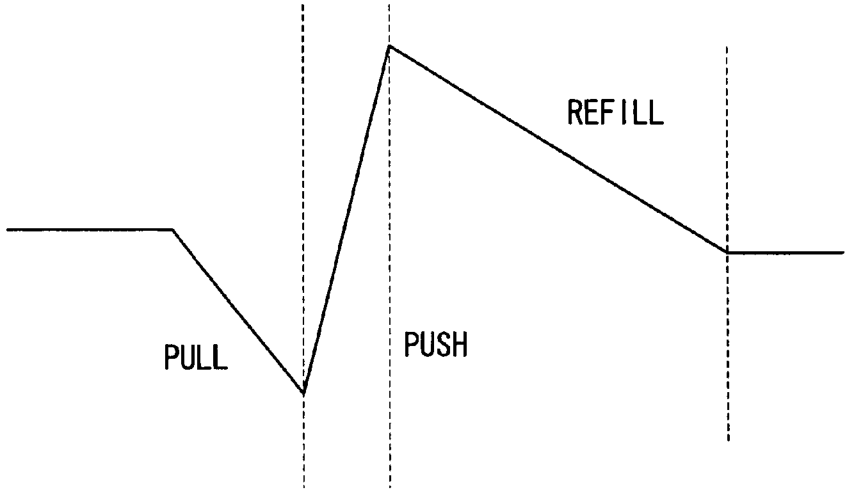
FIG. 13 is a chart showing pressure changes in the pressure chamber when the head shown in FIG. 12 is driven.

FIG. 13 is a chart showing the pressure changes in the pressure chamber when the head with the above-described configuration is driven.

As shown in the FIG. 14, firstly, prior to ink discharge, the diaphragm 90 is driven so that the pressure chamber widens by decreasing the voltage applied to the piezoelectric element 96, and a PULL operation is performed to retract the meniscus. Next, a PUSH operation is performed to apply a positive voltage and rapidly discharge the ink, and the ink droplet is thereby discharged at a sufficient speed. After the ink discharge, the applied voltage is reduced to perform a refill operation for filling the pressure chamber with the ink. During this refilling, the oscillation of the meniscus must be rapidly converged to shorten the time until the next ink discharge.

Since the pressure chamber dividing walls 140 of the pressure chamber have a rigidity gradient as shown in FIG. 12, the following actions and effects are obtained. Since the through rate is high during the PUSH operation, the third layer 134 of low rigidity acts as a rigid member. On the other hand, a damper effect that suppresses the meniscus oscillation of the ink in the pressure chamber is obtained during the refill operation due to the deformation (e.g., the bending in the direction of the arrows in FIG. 12) of the third layer 134 with low rigidity.

The pressure chamber dividing wall 140 of the head in the third embodiment may have a continuous gradient composition, similar to the pressure chamber dividing wall 94 in the head in the first embodiment shown in FIG. 8.

Although the patterned films are formed by the resist patterning and the liftoff during the film forming according to the aerosol deposition method in the above-described embodiments, the present invention is not limited thereto. Masks made from metal or ceramic may be used, and the three-dimensional structure including the pressure chamber dividing wall may be patterned by the mask patterning according to the aerosol deposition method.

Moreover, the above-mentioned embodiments are described with respect to a case where the liquid discharge head relating to the embodiments of the present invention is used as a line-type inkjet head that discharges ink onto a recording paper, whereas the present invention is not limited to this. The present invention may also be applied to a shuttle-type head that moves back and forth reciprocally in a direction orthogonal to the conveyance direction of the print medium. Furthermore, the liquid discharge head relating to the embodiment of the present invention may be used as an image forming head that sprays a treatment liquid or water onto the recording medium, or as a liquid discharge head for forming an image recording medium by spraying a coating liquid onto a base material.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A liquid discharge head, comprising:

a three-dimensional structure which defines a space including a pressure chamber filled with liquid and a flow channel for supplying the liquid to the pressure chamber, the three-dimensional structure being formed by deposition a composition material on a substrate according to a deposition method; and a drive element which causes discharge of the liquid from the pressure chamber through a nozzle, wherein the deposition method includes an aerosol deposition method which enables walls of the pressure chamber to be formed without etching the substrate and without use of an adhesive.

2. The liquid discharge head as defined in claim 1, wherein:

the substrate includes a diaphragm; and the drive element includes a piezoelectric element which drives the diaphragm.

3. The liquid discharge head as defined in claim 2, wherein the piezoelectric element is formed by depositing a piezoelectric material on the diaphragm according to a deposition method.

4. The liquid discharge head as defined in claim 3, wherein the deposition method to form the piezoelectric element includes an aerosol deposition method.

* * * * *